United States Patent
Han et al.

(10) Patent No.: US 8,805,129 B2
(45) Date of Patent: Aug. 12, 2014

(54) OPTICAL DEVICES AND METHODS OF FABRICATING THE SAME

(75) Inventors: Young-Tak Han, Daejeon (KR); Sang Ho Park, Daejeon (KR); Dong-Hun Lee, Daejeon (KR); Jang Uk Shin, Daejeon (KR); Sang-Pil Han, Daejeon (KR); Yongsoon Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 532 days.

(21) Appl. No.: 12/704,512

(22) Filed: Feb. 11, 2010

(65) Prior Publication Data
US 2011/0085760 A1    Apr. 14, 2011

(30) Foreign Application Priority Data

Oct. 13, 2009 (KR) .......................... 10-2009-0097184

(51) Int. Cl.
*G02B 6/12*  (2006.01)
*G02B 6/10*  (2006.01)
*G02B 6/42*  (2006.01)

(52) U.S. Cl.
CPC .............. *G02B 6/423* (2013.01); *G02B 6/4231* (2013.01)
USPC ............................................ 385/14; 385/129

(58) Field of Classification Search
CPC ..... G02B 6/423; G02B 6/4231; G02B 6/4232
USPC ..................... 385/14, 129; 257/797
See application file for complete search history.

(56) References Cited

U.S. PATENT DOCUMENTS

| 5,675,684 A | * | 10/1997 | Hirataka et al. | ................ | 385/88 |
| 5,898,806 A | * | 4/1999 | Nishimoto | ....................... | 385/49 |
| 5,909,524 A | * | 6/1999 | Tabuchi | .......................... | 385/49 |

(Continued)

FOREIGN PATENT DOCUMENTS

| EP | 1 120 672 A1 | 8/2001 |
| JP | H07-045811 A | 2/1995 |

(Continued)

OTHER PUBLICATIONS

Qing Tan et al. "Soldering Technology for Optoelectronic Packaging" Electronic Components and Technology Conference 1996, p. 26-36.

(Continued)

*Primary Examiner* — Uyen Chau N Le
*Assistant Examiner* — John M Bedtelyon
(74) *Attorney, Agent, or Firm* — Rabin & Berdo, P.C.

(57) ABSTRACT

Provided is an optical device. The optical device includes a substrate having a waveguide region and a mounting region, a planar lightwave circuit (PLC) waveguide including a lower-clad layer and an upper-clad layer on the waveguide region of the substrate and a platform core between the lower-clad layer and the upper-clad layer, a terrace defined by etching the lower-clad layer on the mounting region of the substrate, the terrace including an interlocking part, an optical active chip mounted on the mounting region of the substrate, the optical active chip including a chip core therein, and a chip alignment mark disposed on a mounting surface of the optical active chip. The optical active chip is aligned by interlocking between the interlocking part of the terrace and the chip alignment mark of the optical active chip and mounted on the mounting region.

20 Claims, 14 Drawing Sheets

(56) References Cited

U.S. PATENT DOCUMENTS

| | | | |
|---|---|---|---|
| 6,344,148 B1 * | 2/2002 | Park et al. | 216/2 |
| 6,799,713 B2 * | 10/2004 | Lee et al. | 228/180.22 |
| 6,804,444 B2 * | 10/2004 | Shin et al. | 385/131 |
| 6,839,497 B2 * | 1/2005 | Park et al. | 385/129 |
| 6,841,860 B2 * | 1/2005 | Lee et al. | 257/678 |
| 6,912,332 B2 * | 6/2005 | Han et al. | 385/14 |
| 7,308,167 B2 * | 12/2007 | Trott et al. | 385/14 |
| 7,684,660 B2 * | 3/2010 | Braunisch et al. | 385/14 |
| 7,720,335 B2 * | 5/2010 | Pearson et al. | 385/37 |
| 7,778,504 B2 * | 8/2010 | Watanabe et al. | 385/14 |
| 8,027,553 B2 * | 9/2011 | Takai et al. | 385/14 |
| 8,036,507 B2 * | 10/2011 | Watanabe | 385/52 |
| 8,594,477 B2 * | 11/2013 | Watanabe | 385/129 |
| 2004/0028312 A1 | 2/2004 | Park et al. | |

FOREIGN PATENT DOCUMENTS

| | | |
|---|---|---|
| JP | H11-054563 A | 2/1999 |
| JP | 2000-049102 A | 2/2000 |
| JP | 2004-031906 A | 1/2004 |

OTHER PUBLICATIONS

M. Hutter et al. "Precise Flip Chip Assembly Using Electroplated AuSn20 and SnAg3.5 Solder" Electronic Components and Technology Conference 2006, p. 1087-1904.

E.B. Flint, "Self-Aligned Optoelectronic Packaging for Computer Data Links", Official Documents Research and Guidelines on Ergonomics Issues, pp. 264 and 265, Jan. 1, 1992.

* cited by examiner

OPTICAL DEVICES AND METHODS OF FABRICATING THE SAME

CROSS-REFERENCE TO RELATED APPLICATIONS

This U.S. non-provisional patent application claims priority under 35 U.S.C. §119 of Korean Patent Application No. 10-2009-0097184, filed on Oct. 13, 2009, the entire contents of which are hereby incorporated by reference.

BACKGROUND

The present disclosure herein relates to optical devices and methods of fabricating the same, and more particularly, to optical devices in which an optical active chip such as a laser diode and a photodiode and a planar lightwave circuit platform having an integrated light waveguide are hybrid-coupled and methods of fabricating the same.

In an optical network for high-speedily and effectively transmitting a large amount of data, it is necessary that an optical active device performing light source, optical detection, and optical amplification functions and a light waveguide in which optical wavelength division and optical multiplexing are possible are integrated to realize an optical transceiver and optical amplification module at a low price.

Such integration technologies are divided into a monolithic integration technology in which an optical active device and a light waveguide are realized and integrated using an optical semiconductor that is a single material and a planar lightwave circuit (PLC) hybrid integration technology in which an optical active device and a PLC platform are integrated using a flip-chip (F/C) bonding.

In the monolithic integration technology, when each of optical devices is integrated on a single substrate, it may be difficult to realize an optical transceiver module at a low price due to limitations in optimization of the optical devices, reproducibility, and productivity. On the other hand, in the PLC hybrid integration technology, an optical active device having optimal performances may be hybrid-integrated with a PLC platform having a light waveguide function and a wavelength division multiplexing (WDM) filter function to improve productivity. Thus, the PLC hybrid integration technology is considered as a core technology that may realize the optical transceiver and optical amplification module at a low price.

A PLC platform may be easily manufactured using existing light waveguide manufacturing technologies and platform post-processes such as an etching process and a metal deposition process. Thus, since optical coupling efficiency between a semiconductor chip that is an optical active device and the PLC platform including an integrated light waveguide affects performances of a hybrid integrated device, it is necessary to devise and establish an F/C bonding structure and method, which may improve alignment accuracy therebetween.

SUMMARY OF THE INVENTIVE CONCEPT

Embodiments of the inventive concept provide an optical device that may improve alignment accuracy to enhance optical coupling efficiency when an optical active chip is bonded to a PLC platform.

Embodiments of the inventive concept also provide a method of fabricating an optical device, which may improve alignment accuracy to enhance optical coupling efficiency when an optical active chip is bonded to a PLC platform.

The object of the present invention is not limited to the aforesaid, but other objects not described herein will be clearly understood by those skilled in the art from descriptions below.

Embodiments of the inventive concept provide optical devices which include things as in the following: a substrate having a waveguide region and a mounting region; a planar lightwave circuit (PLC) waveguide including a lower-clad layer and an upper-clad layer on the waveguide region of the substrate and a platform core between the lower-clad layer and the upper-clad layer; a terrace defined by etching the lower-clad layer on the mounting region of the substrate, the terrace including a trench; a platform under bump metallurgy (UBM) disposed on the etched surface of the lower-clad layer around the terrace disposed on the mounting region of the substrate; an optical active chip mounted on the mounting region of the substrate and including a chip core therein; a chip UBM and a chip alignment mark disposed on a mounting surface of the optical active chip; and a solder film electrically connecting the platform UBM to the chip UBM. The optical active chip is aligned by interlocking between the trench of the terrace and the chip alignment mark of the optical active chip and mounted on the mounting region.

In some embodiments, a distance between an inner circumference surface of the trench of the terrace and an outer circumference surface of the chip alignment mark of the optical active chip may range from about 1 µm to about 2 µm.

In other embodiments, the solder film may have a thickness ranging from about 2 µm to about 8 µm.

In still other embodiments, the solder film may include an AuSn solder.

In even other embodiments, the optical devices may further include an additional solder film disposed on the chip alignment mark.

In yet other embodiments, a distance between the PLC waveguide and the optical active chip may range from about 2.5 µm to about 20 µm.

In other embodiments of the inventive concept, other optical devices include things as follows: a substrate having a waveguide region and a mounting region; a PLC waveguide including a lower-clad layer and an upper-clad layer on the waveguide region of the substrate and a platform core between the lower-clad layer and the upper-clad layer; a terrace defined by etching the lower-clad layer on the mounting region of the substrate; a platform UBM disposed on the etched surface of the lower-clad layer around the terrace disposed on the mounting region of the substrate; a platform alignment mark disposed on an upper surface of the terrace; an optical active chip mounted on the mounting region of the substrate and including a chip core therein; a chip UBM and a chip alignment mark disposed on a mounting surface of the optical active chip; and a solder film electrically connecting the platform UBM to the chip UBM. The optical active chip is aligned by interlocking between the platform alignment mark of the terrace and the chip alignment mark of the optical active chip and mounted on the mounting region.

In some embodiments, the platform alignment mark of the terrace and the chip alignment mark of the optical active chip may have intaglio and relief shapes corresponding to each other, respectively. A distance between the platform alignment mark of the terrace and the chip alignment mark of the optical active chip may range from about 1 µm to about 2 µm.

In other embodiments, the solder film may have a thickness ranging from about 2 µm to about 8 µm.

In still other embodiments, the solder film may include an AuSn solder.

In even other embodiments, a distance between the PLC waveguide and the optical active chip may range from about 2.5 µm to about 20 µm.

In still other embodiments of the inventive concept, methods of fabricating an optical device including: sequentially forming a lower-clad layer, a platform core, and an upper-clad layer on a substrate having a waveguide region and a mounting region; performing a first etch process on the upper-clad layer, the platform core, and the lower-clad layer disposed on the mounting region of the substrate to form a PLC waveguide in the waveguide region and a lower-clad layer having a first height in the mounting region; performing a second etch process on the lower-clad layer having the first height disposed on the mounting region of the substrate to form a terrace having the first height and a trench and a lower-clad layer having a second height; forming a platform UBM on the lower-clad layer having the second height around the terrace disposed on the mounting region of the substrate; forming a chip UBM on a mounting surface of the optical active chip including a chip core therein; forming a chip alignment mark on a mounting surface of an optical active chip; forming a solder film on at least one of the platform UBM and the chip UBM; and mounting the optical active chip on the mounting region of the substrate to electrically connect the platform UBM to the chip UBM by the solder film. The optical active chip is aligned by interlocking between the trench of the terrace and the chip alignment mark of the optical active chip and mounted on the mounting region.

In some embodiments, a distance between an inner circumference surface of the trench of the terrace and an outer circumference surface of the chip alignment mark of the optical active chip may range from about 1 µm to about 2 µm.

In other embodiments, the solder film may be formed on each of the platform UBM and the chip UBM. In this case, the solder film may have a thickness ranging from about 1 µm to about 4 µm.

In still other embodiments, the solder film may include an AuSn solder.

In even other embodiments, the chip UBM and the chip alignment mark may be formed at the same time.

In yet other embodiments, the optical active chip may further include an additional solder film disposed on the chip alignment mark.

In further embodiments, a distance between the PLC waveguide and the optical active chip may range from about 2.5 µm to about 20 µm.

In even other embodiments of the inventive concept, methods of fabricating another optical device including: sequentially forming a lower-clad layer, a platform core, and an upper-clad layer on a substrate having a waveguide region and a mounting region; performing a first etch process on the upper-clad layer, the platform core, and the lower-clad layer disposed on the mounting region of the substrate to form a PLC waveguide in the waveguide region and a lower-clad layer having a first height in the mounting region; performing a second etch process on the lower-clad layer having the first height disposed on the mounting region of the substrate to form a terrace having the first height and a lower-clad layer having a second height; forming a platform UBM on the lower-clad layer having the second height around the terrace disposed on the mounting region of the substrate; forming a platform alignment mark on an upper surface of the terrace disposed on the mounting region of the substrate; forming a chip UBM on a mounting surface of the optical active chip including a chip core therein; forming a chip alignment mark on a mounting surface of an optical active chip; forming a solder film on at least one of the platform UBM and the chip UBM; and mounting the optical active chip on the mounting region of the substrate to electrically connect the platform UBM to the chip UBM by the solder film. The optical active chip is aligned by interlocking between the platform alignment mark of the terrace and the chip alignment mark of the optical active chip and mounted on the mounting region.

In some embodiments, the platform alignment mark of the terrace and the chip alignment mark of the optical active chip may have intaglio and relief shapes corresponding to each other, respectively. A distance between the platform alignment mark of the terrace and the chip alignment mark of the optical active chip may range from about 1 µm to about 2 µm.

In other embodiments, the solder film may be formed on each of the platform UBM and the chip UBM. The solder film may have a thickness ranging from about 1 µm to about 4 µm.

In still other embodiments, the solder film may include an AuSn solder.

In even other embodiments, the platform UBM and the platform alignment mark may be formed at the same time.

In yet other embodiments, the chip UBM and the chip alignment mark may be formed at the same time.

In further embodiments, a distance between the PLC waveguide and the optical active chip may range from about 2.5 µm to about 20 µm.

BRIEF DESCRIPTION OF THE DRAWINGS

The accompanying drawings are included to provide a further understanding of the inventive concept, and they are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Figure 1A:
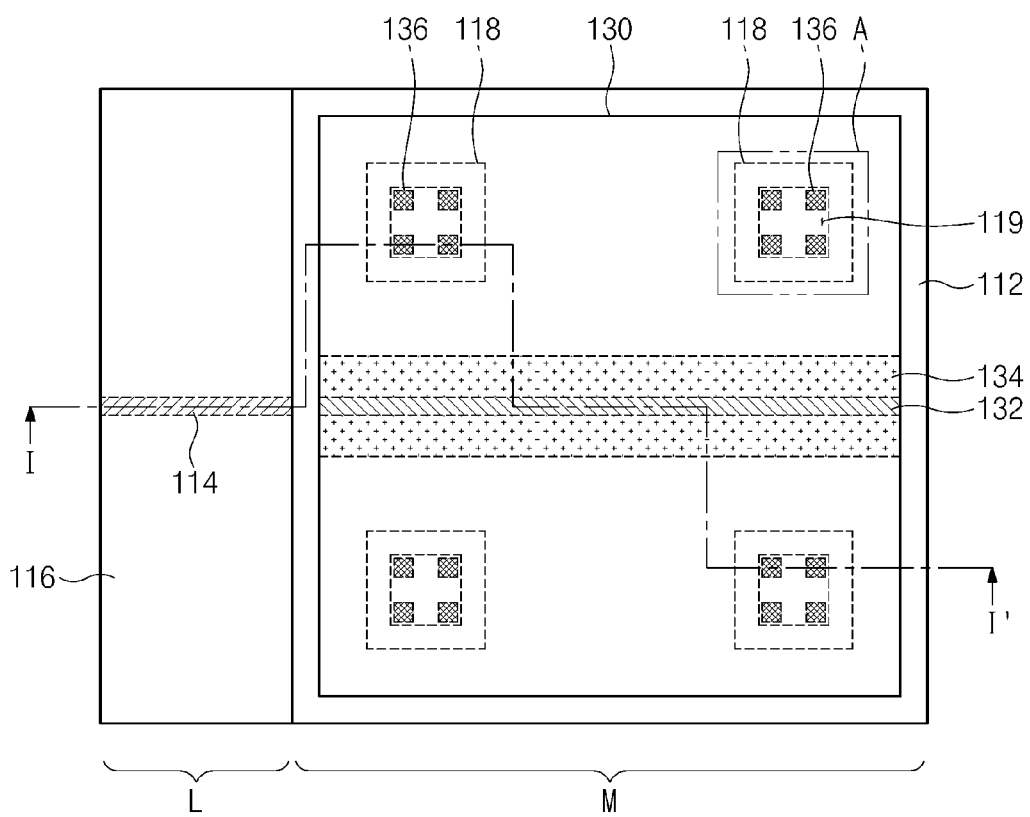
FIG. 1A is a plan view of an optical device according to an embodiment of the inventive concept.

Preferred embodiments of the inventive concept will be described below in more detail with reference to the accompanying drawings. Advantages and features of the inventive concept, and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete and will fully convey the scope of the inventive concept to those skilled in the art.

Further, the inventive concept is only defined by scopes of claims. Like reference numerals refer to like elements throughout.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Also, since preferred embodiments are provided below, the order of the reference numerals given in the description is not limited thereto. It will be understood that when an element such as a layer, film, region, or substrate is referred to as being "on" another element, it can be directly on the other element or intervening elements may also be present.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views but may include other shapes that may be created according to manufacturing processes. For example, an etching region illustrated in a right angle shape may have a rounded shape or a shape having a predetermined curvature. Areas exemplified in the drawings have general properties and are used to illustrate a specific shape of a semiconductor package region. Thus, this should not be construed as limited to the scope of the present invention.

Figure 1B:
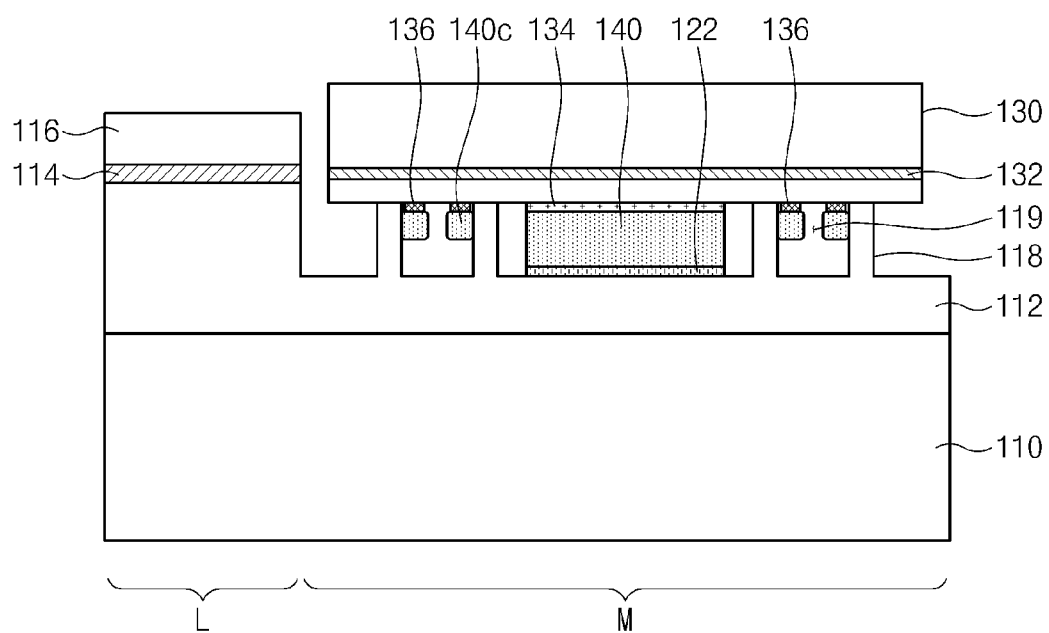
FIG. 1B is a sectional view taken along line I-I' of FIG. 1A.
Figure 1C:
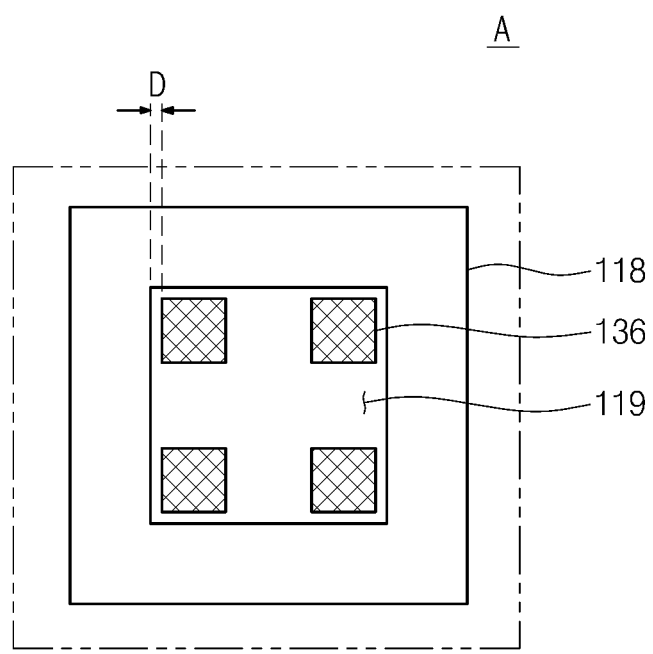
FIG. 1C is an enlarged plan view illustrating a portion A of FIG. 1A.

FIG. 1A is a plan view of an optical device according to an embodiment of the inventive concept, FIG. 1B is a sectional view taken along line I-I' of FIG. 1A, and FIG. 1C is an enlarged plan view illustrating a portion A of FIG. 1A.

Referring to FIGS. 1A through 1C, an optical device may include a planar lightwave circuit (PLC) platform having a light waveguide region L and a mounting region M and an optical active chip 130 mounted on the mounting region M of the PLC platform.

The PLC platform may include a substrate 110. The substrate 110 may include a silicon (Si) substrate.

A PLC waveguide including a lower-clad layer 112, a PLC (platform) core 114, and an upper-clad layer 116 may be disposed on the light waveguide region L of the PLC platform. The lower-clad layer 112, the PLC core 114, and the upper-clad layer 116 may be formed of silica. Thus, the PLC waveguide may include a silica light waveguide.

A terrace 118 having a trench 119 formed by etching the lower-clad layer 112 may be disposed on the mounting region M of the PLC platform. A platform under bump metallurgy (UBM) 122 may be disposed on the lower-clad layer 112 around the terrace 118 on the mounting region M of the PLC platform. The platform UBM 122 may include a 3-layer of Cr/Ni/Au, NiCr/Ni/Au, Ti/Ni/Au, Cr/Pt/Au, NiCr/Pt/Au, or Ti/Pt/Au or a 2-layer of Ni/Au.

The optical active chip 130 may include a chip core 132 therein. The optical active chip 130 may include a laser diode or a photodiode. A chip UBM 134 and a chip alignment mark 136 may be disposed on a mounting surface of the optical active chip 130. The chip UBM 134 may include a 3-layer of Cr/Ni/Au, NiCr/Ni/Au, Ti/Ni/Au, Cr/Pt/Au, NiCr/Pt/Au, or Ti/Pt/Au or a 2-layer of Ni/Au. The chip alignment mark 136 may be formed of the same material as the chip UBM 134.

The optical active chip 130 may be mounted on the mounting region M of the PLC platform using flip-chip (F/C) bonding. That is, the optical active chip 130 may be mounted on the mounting region M of the PLC platform to electrically connect the platform UBM 122 to the chip UBM 134 by a solder film 140. The solder film 140 may include an AuSn solder. The solder film 140 may have a thickness ranging from about 2 μm to about 8 μm.

Since the chip core 132 of the optical active chip 130 such as the laser diode or the photodiode is disposed within a range of about 2 μm to about 5 μm from a mounting surface (p-side surface) of the optical active chip 130, it may not be necessary to deeply etch the mounting region M of the PLC platform. Thus, the solder film 140 having a thickness of several micrometers may be used.

An inner circumference surface of the trench 119 of the terrace 118 may have a shape corresponding to that of an outer circumference surface of the chip alignment mark 136 of the optical active chip 130. When a plane section of the chip alignment mark 136 of the optical active chip 130 is a closed figure, a plane section of the inner circumference surface of the trench 119 of the terrace 118 may be a closed figure having the same configuration with an area greater than that of the plane section of the chip alignment mark 136 of the optical active chip 130. On the other hand, as shown in FIGS. 1A and 1C, when the chip alignment mark 136 of the optical active chip 130 includes a plurality of patterns, the plane section of the inner circumference surface of the trench 119 of the terrace 118 may be a closed figure having the same configuration with an area greater than that of the outer circumference surface of the chip alignment mark 136 contacting and surrounding the plurality of patterns.

The optical active chip 130 may be aligned by interlocking between the trench 119 of the terrace 118 and the chip alignment mark 136 of the optical active chip 130 and mounted on the mounting region M of the PLC platform. Thus, the optical active chip 130 is not vertically moved by the terrace 118, and thus vertically aligned with the PLC platform. Also, the optical active chip 130 is not horizontally moved by the interlocking between the trench 119 of the terrace 118 and the chip alignment mark 136 of the optical active chip 130, and thus horizontally aligned with the PLC platform.

Generally, a commercialized F/C bonding equipment has alignment accuracy of about 1 μm. The optical active chip 130 and the PLC platform are aligned with each other using the commercialized F/C bonding equipment. Thereafter, when a predetermined load is applied to only contact the optical active chip 130 with the PLC platform, alignment accuracy therebetween is determined by the alignment accuracy of the F/C bonding equipment. However, to mount the optical active chip 130 on the PLC platform, when the temperature of the F/C bonding equipment increases to melt the solder film 140 disposed between the optical active chip 130 and the PLC platform, significant misalignment may occur during the melting of the solder film 140 due to the difference of thermal expansion coefficients between the optical active chip 130, the PLC platform, and the F/C bonding equipment. Also, when the solder film 140 is melted, the optical active chip 130 may be slipped by a molten solder in case where an excessively large amount of the molten solder is provided. As a result, the misalignment of more than several micrometers may occur, and thus, the optical coupling efficiency may be significantly reduced.

However, since the optical device according to an embodiment of the inventive concept is not horizontally moved by the interlocking between the trench 119 of the terrace 118 and the chip alignment mark 136 of the optical active chip 130, the misalignment occurring when the solder film 140 is melted to mount the optical active chip 130 on the PLC platform may be minimized.

A distance D between the inner circumference surface of the trench 119 of the terrace 118 and the outer circumference surface of the chip alignment mark 136 of the optical active chip 130 may range from about 1 μm to about 2 μm. Thus, although the alignment occurs when the solder film 140 is melted to mount the optical active chip 130 on the PLC platform, the alignment accuracy within about 2 μm may be secured.

An additional solder film 140c may be further disposed on the chip alignment mark 136. The additional solder film 140c may additionally provide a vertical height difference for forming an interlocking structure between the trench 119 of the terrace 118 and the chip alignment mark 136 of the optical active chip 130. Besides, the additional solder film 140c may be melted when the optical active chip 130 is mounted on the PLC platform to further closely attach the optical active chip 130 to the trench 119 of the terrace 118. Therefore, the alignment accuracy may be further improved.

A distance between the PLC waveguide and the optical active chip 130 may range from about 2.5 μm to about 20 μm.

FIGS. 2A through 2F are sectional views taken along line I-I' of FIG. 1A, for explaining a method of fabricating the optical device according to an embodiment of the inventive concept.

Figure 2A:
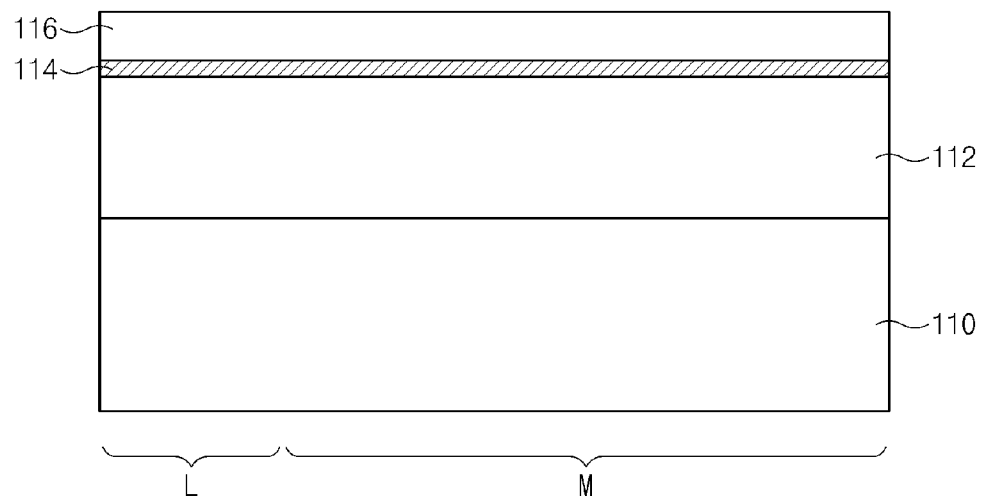
FIGS. 2A through 2F are sectional views taken along line I-I' of FIG. 1A, for explaining a method of fabricating the optical device according to an embodiment of the inventive concept.

Referring to FIG. 2A, a lower-clad layer 112, a PLC core 114, and an upper-clad layer 116 may be sequentially formed on a substrate 110 including a light waveguide region L and a mounting region M.

The substrate 110 may include a Si substrate. The lower-clad layer 112, the PLC core 114, and the upper-clad layer 116 may be formed of a silica film.

Figure 2B:
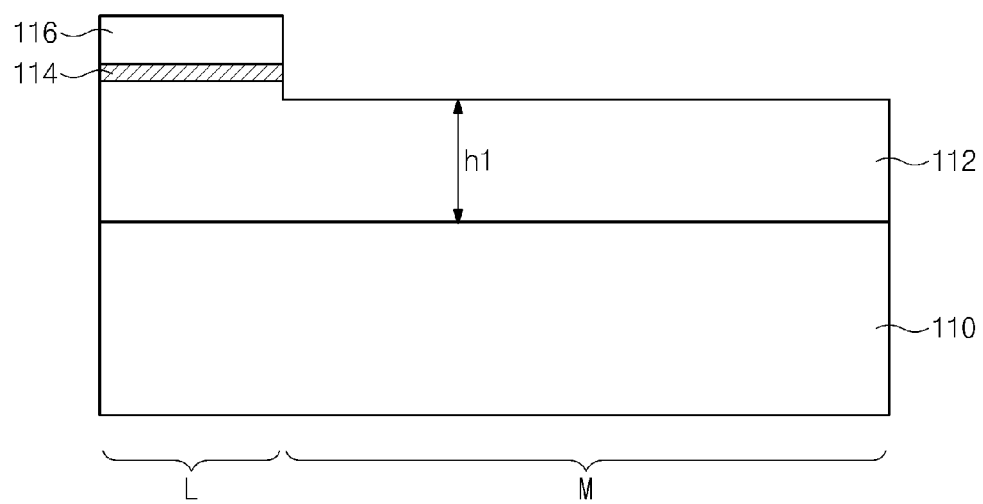

Referring to FIG. 2B, a first etch process is performed on the upper-clad layer 116, the PLC core 114, and the lower-clad layer 112 disposed on the mounting region M of the substrate 110 to form a PLC waveguide including the lower-clad layer 112, the PCL core 114, and the upper-clad layer 116 in the light waveguide region L and the lower-clad layer 112 having a first height h1 in the mounting region M. Thus, the PLC waveguide may include a silica light waveguide.

Figure 2C:
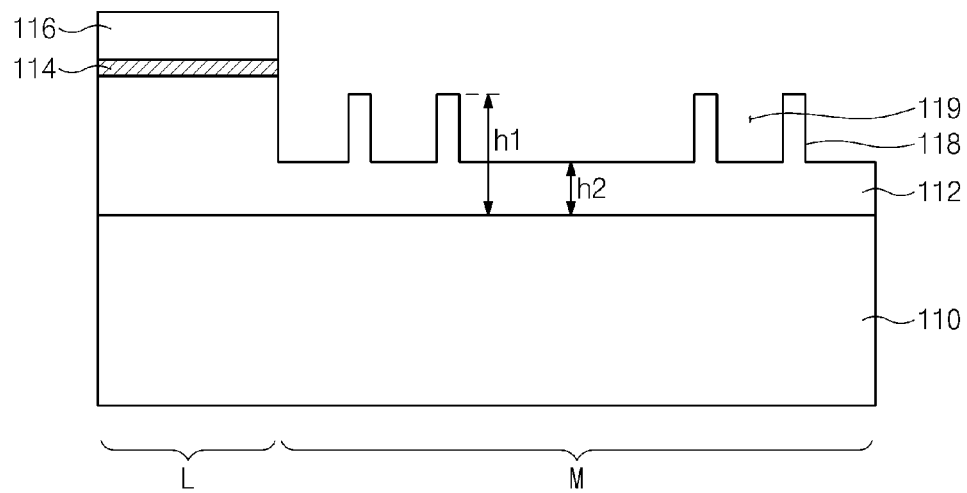

Referring to FIG. 2C, a second etch process is performed on the lower-clad layer 112 having the first height h1 in the mounting region M of the substrate 110 to form a terrace 118 having the first height h1 and a trench 119 and the lower-clad layer 112 having a second height h2.

The trench 119 may be formed together with the terrace 118 having the first height h1 by simply changing a shape of a photomask pattern used for the second etch process for forming the terrace 118 having the first height h1. Thus, an additional process for forming the trench 119 is not required.

Figure 2D:
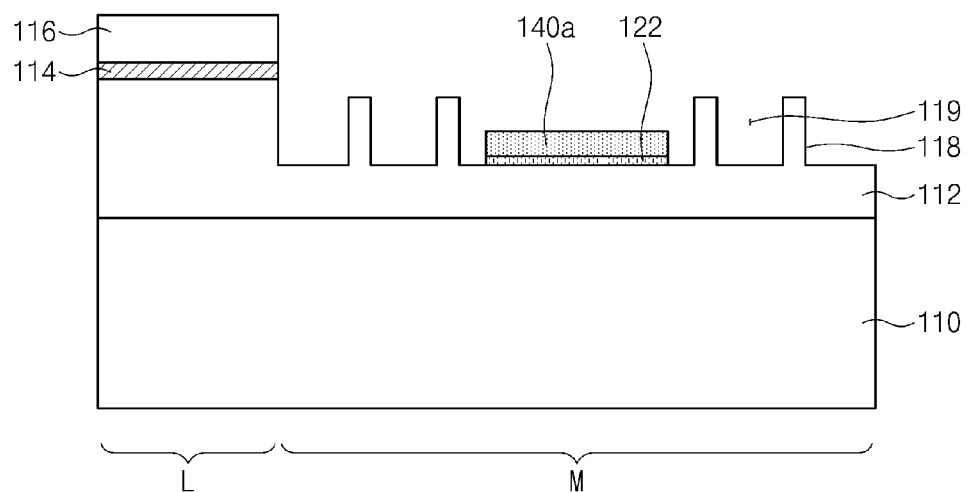

Referring to FIG. 2D, a platform UBM 122 may be formed on the lower-clad layer 112 having the second height h2 around the terrace 118 formed on the mounting region M of the substrate 110. The platform UBM 122 may include a 3-layer of Cr/Ni/Au, NiCr/Ni/Au, Ti/Ni/Au, Cr/Pt/Au, NiCr/Pt/Au, or Ti/Pt/Au or a 2-layer of Ni/Au.

Thus, the PLC waveguide may be formed in the light waveguide region L, and a PLC platform including the terrace 118 having the trench 119 may be formed in the mounting region M.

A solder film 140a for platform is formed on the platform UBM 122. The solder film 140a for platform may include an AuSn solder. The solder film 140a for platform may have a thickness ranging from about 1 μm to about 4 μm. When a solder film for chip (see reference numeral 140b of FIG. 2E) having a sufficient thickness (about 2 μm to 8 μm) is formed on a chip UBM (see reference numeral 134 of FIG. 2E) formed on a mounting surface of an optical active chip (see reference numeral 130 of FIG. 2E), the formation of the solder film 140a for platform may be omitted.

Figure 2E:
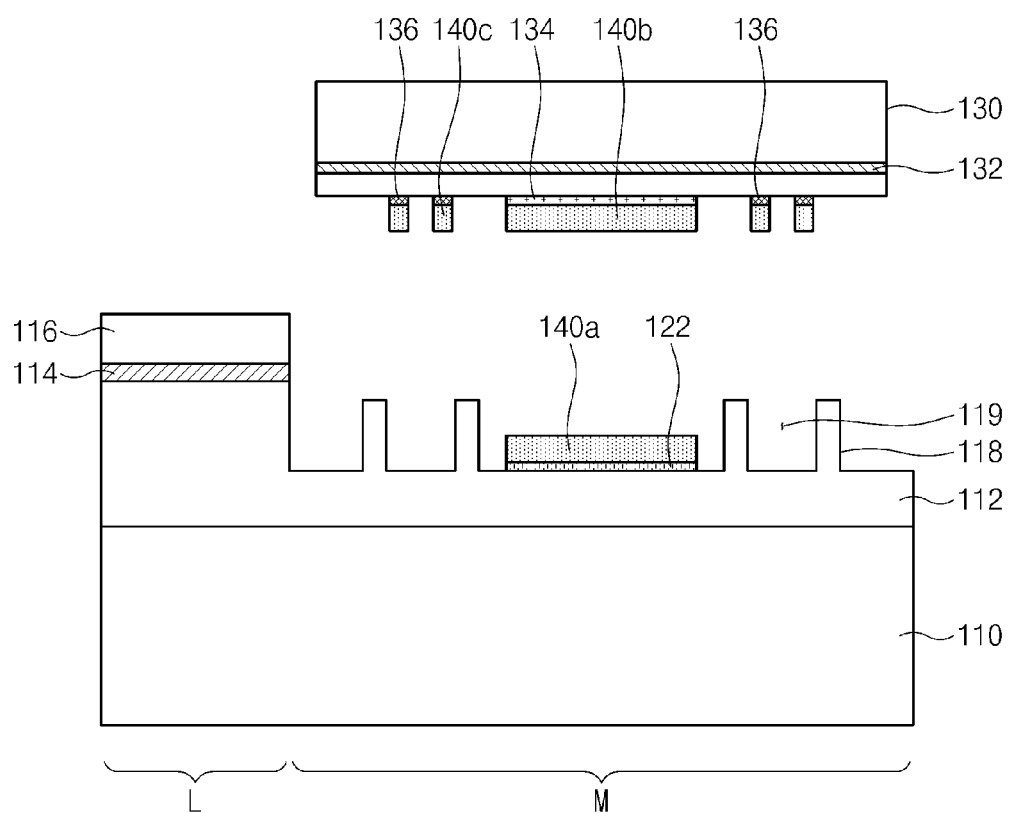

Referring to FIG. 2E, the optical active chip 130 including a chip core 132 therein is prepared. The optical active chip 130 may include a laser diode or a photodiode.

The chip UBM 134 and a chip alignment mark 136 are formed on the mounting surface of the optical active chip 130. Each of the chip UBM 134 and the chip alignment mark 136 may include a 3-layer of Cr/Ni/Au, NiCr/Ni/Au, Ti/Ni/Au, Cr/Pt/Au, NiCr/Pt/Au, or Ti/Pt/Au or a 2-layer of Ni/Au. The chip UBM 134 and the chip alignment mark 136 may be formed using processes and materials different from each other or formed at the same time using the same process and material.

An inner circumference surface of the trench 119 of the terrace 118 may have a shape corresponding to that of an outer circumference surface of the chip alignment mark 136 of the optical active chip 130. When a plane section of the chip alignment mark 136 of the optical active chip 130 is a closed figure, a plane section of the inner circumference surface of the trench 119 of the terrace 118 may be a closed figure having the same configuration with an area greater than that of the plane section of the chip alignment mark 136 of the optical active chip 130. On the other hand, as shown in FIGS. 1A and 1C, when the chip alignment mark 136 of the optical active chip 130 includes a plurality of patterns, the plane section of the inner circumference surface of the trench 119 of the terrace 118 may be a closed figure having the same configuration with an area greater than that of the outer circumference surface of the chip alignment mark 136 contacting and surrounding the plurality of patterns. A distance (see reference symbol D of FIG. 1C) between the inner circumference surface of the trench 119 of the terrace 118 and the outer circumference surface of the chip alignment mark 136 may range from about 1 μm to about 2 μm.

The solder film 140b for chip is formed on the chip UBM 134. The solder film 140b for chip may include an AuSn solder. The solder film 140b for chip may have a thickness ranging from about 1 μm to about 4 μm. When the solder film 140a for platform having the sufficient thickness (about 2 μm to 8 μm) is formed on the platform UBM 122 formed on the lower-clad layer 112 having the second height h2 on the mounting region M of the substrate 110, the formation of the solder film 140b for chip may be omitted.

When the solder film 140b for chip is formed, an additional solder film 140c may be further formed on the chip alignment nark 136. The additional solder film 140c may additionally provide a vertical height difference for forming an interlocking structure between the trench 119 of the terrace 118 and the chip alignment mark 136 of the optical active chip 130 when the optical active chip 130 is mounted on the mounting region M of the PLC platform (see FIG. 2F). Besides, the additional solder film 140c may be melted when the optical active chip 130 is mounted on the PLC platform to further closely attach the optical active chip 130 to the trench 119 of the terrace 118. Therefore, the alignment accuracy may be further improved.

Figure 2F:
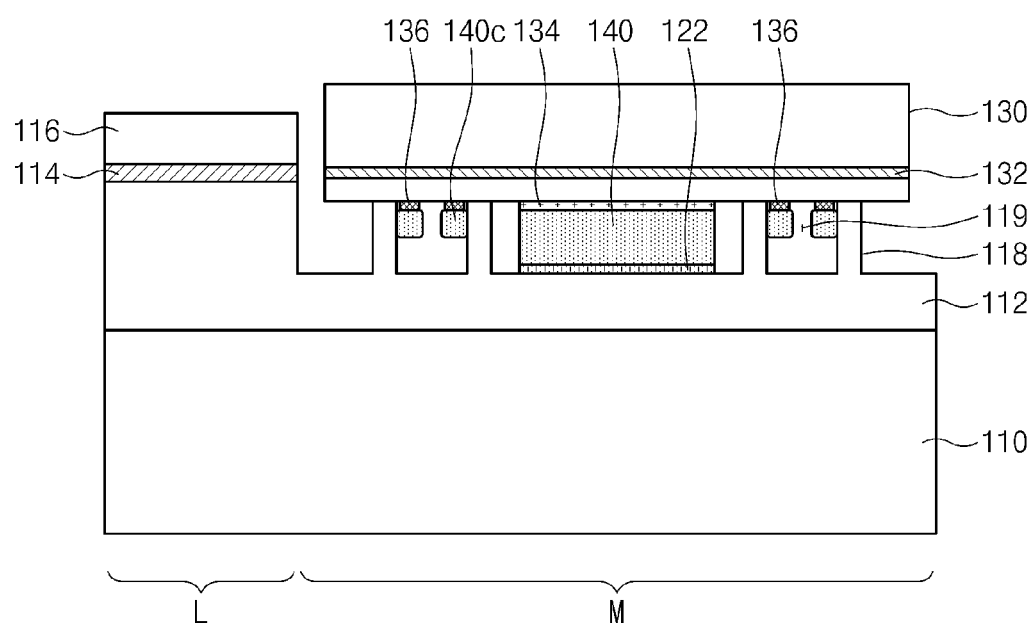

Referring to FIG. 2F, the optical active chip 130 is mounted on the mounting region M of the substrate 110 to electrically connect the platform UBM 122 to the chip UBM 134 by a solder film 140.

As described above, the solder film 140 may represents a solder film formed on the platform UBM 122 or the chip UBM 134 or all of the solder film 140a for platform and the solder film 140b for chip formed on the platform UBM 122 and the chip UBM 134, respectively.

The optical active chip 130 may be aligned by interlocking between the trench 119 of the terrace 118 and the chip alignment mark 136 of the optical active chip 130 and mounted on the mounting region M of the PLC platform. Thus, the optical active chip 130 is not vertically moved by the terrace 118 and therefore vertically aligned with the PLC platform. Also, the optical active chip 130 is not horizontally moved by the interlocking between the trench 119 of the terrace 118 and the chip alignment mark 136 of the optical active chip 130 and thus horizontally aligned with the PLC platform.

Generally, a commercialized F/C bonding equipment has alignment accuracy of about 1 μm. The optical active chip 130 and the PLC platform are aligned with each other using the commercialized F/C bonding equipment. Thereafter, when a predetermined load is applied to only contact the optical active chip 130 with the PLC platform, alignment accuracy therebetween is determined by the alignment accuracy of the F/C bonding equipment. However, to mount the optical active chip 130 on the PLC platform, when the temperature of the F/C bonding equipment increases to melt the solder film 140 disposed between the optical active chip 130 and the PLC platform, significant misalignment may occur during the melting of the solder film 140 due to the difference of thermal expansion coefficients between the optical active chip 130, the PLC platform, and the F/C bonding equipment. Also, when the solder film 140 is melted, the optical active chip 130 may be slipped by a molten solder in case where an excessively large amount of the molten solder is provided. As a result, the misalignment of more than several micrometers may occur, and thus, the optical coupling efficiency may be significantly reduced.

However, since the optical device according to an embodiment of the inventive concept is not horizontally moved by the interlocking between the trench 119 of the terrace 118 and the chip alignment mark 136 of the optical active chip 130, the misalignment occurring when the solder film 140 is melted to mount the optical active chip 130 on the PLC platform may be minimized.

A distance between the inner circumference surface of the trench 119 of the terrace 118 and the outer circumference surface of the chip alignment mark 136 of the optical active chip 130 may range from about 1 μm to about 2 μm. Thus, although the alignment occurs when the solder film 140 is melted to mount the optical active chip 130 on the PLC platform, the alignment accuracy within about 2 μm may be secured.

In the optical device fabricated using the above-described methods, a distance between the PLC waveguide and the optical active chip 130 may range from about 2.5 μm to about 20 μm.

Figure 3A:
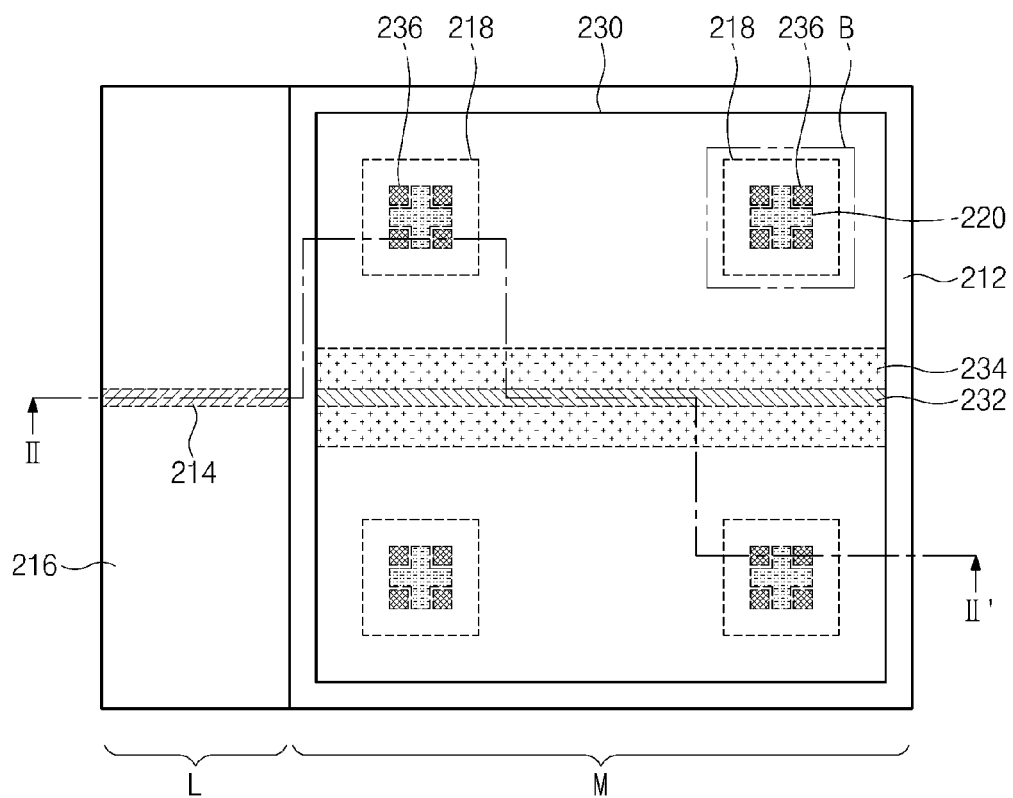
FIG. 3A is a plan view of an optical device according to another embodiment of the inventive concept.
Figure 3B:
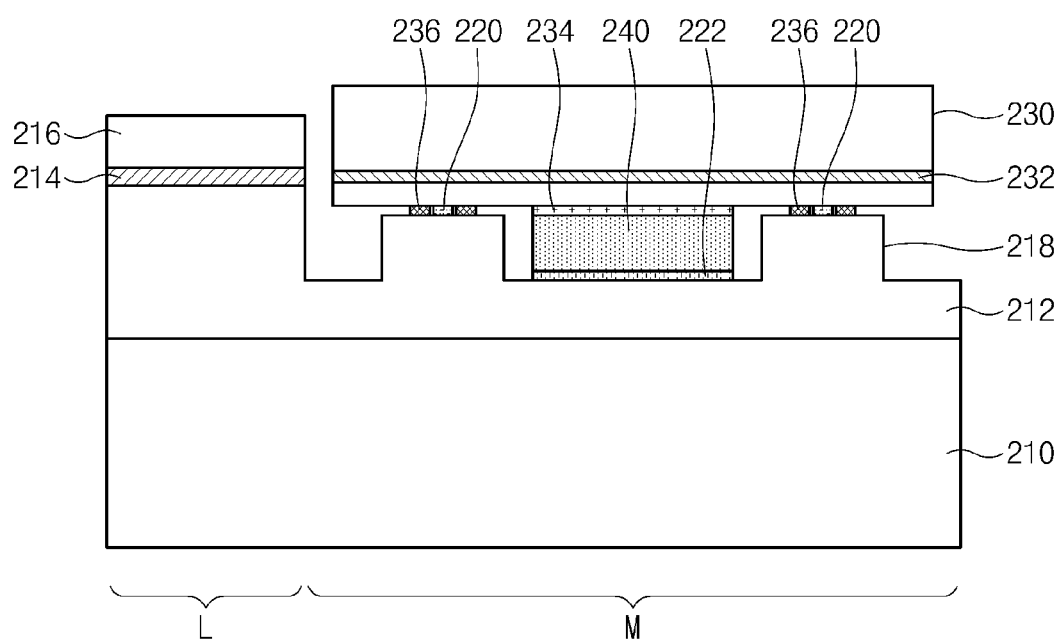
FIG. 3B is a sectional view taken along line II-II' of FIG. 3A.
Figure 3C:
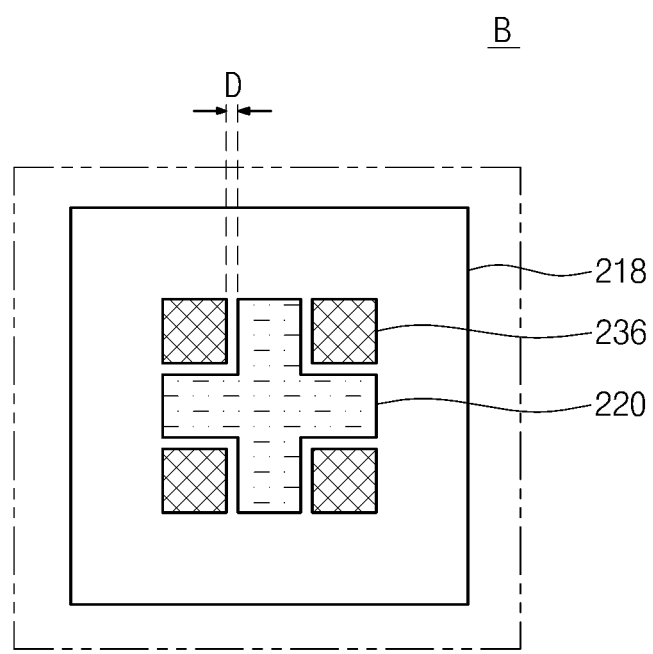
FIG. 3C is an enlarged plan view illustrating a portion B of FIG. 3A.

FIG. 3A is a plan view of an optical device according to another embodiment of the inventive concept, FIG. 3B is a sectional view taken along line II-II' of FIG. 3A, and FIG. 3C is an enlarged plan view illustrating a portion B of FIG. 3A.

Referring to FIGS. 3A through 3C, an optical device may include a PLC platform having a light waveguide region L and a mounting region M and an optical active chip 230 mounted on the mounting region M of the PLC platform.

The PLC platform may include a substrate 210. The substrate 210 may include a Si substrate.

A PLC waveguide including a lower-clad layer 212, a PLC core 214, and an upper-clad layer 216 may be disposed on the light waveguide region L of the PLC platform. The lower-clad layer 212, the PLC core 214, and the upper-clad layer 216 may be formed of silica. Thus, the PLC waveguide may include a silica light waveguide.

A terrace 218 formed by etching the lower-clad layer 212 may be disposed on the mounting region M of the PLC platform. A platform UBM 222 may be disposed on the lower-clad layer 212 around the terrace 218 on the mounting region M of the PLC platform. The platform UBM 222 may include a 3-layer of Cr/Ni/Au, NiCr/Ni/Au, Ti/Ni/Au, Cr/Pt/Au, NiCr/Pt/Au, or Ti/Pt/Au or a 2-layer of Ni/Au. A platform alignment mark 220 may be disposed on an upper surface of the terrace 218. The platform alignment mark 220 may be formed of the same material as the platform UBM 222.

The optical active chip 230 may include a chip core 232 therein. The optical active chip 230 may include a laser diode or a photodiode. A chip UBM 234 and a chip alignment mark 236 may be disposed on a mounting surface of the optical active chip 230. The chip UBM 234 may include a 3-layer of Cr/Ni/Au, NiCr/Ni/Au, Ti/Ni/Au, Cr/Pt/Au, NiCr/Pt/Au, or Ti/Pt/Au or a 2-layer of Ni/Au. The chip alignment mark 236 may be formed of the same material as the chip UBM 234.

The optical active chip 230 may be mounted on the mounting region M of the PLC platform using F/C bonding. That is, the optical active chip 230 may be mounted on the mounting region M of the PLC platform to electrically connect the platform UBM 222 to the chip UBM 234 by a solder film 240. The solder film 240 may include an AuSn solder. The solder film 240 may have a thickness ranging from about 2 μm to about 8 μm.

Since the chip core 232 of the optical active chip 230 such as the laser diode and the photodiode is disposed within a range of about 2 μm to about 5 μm from a mounting surface (p-side surface) of the optical active chip 230, it may not be necessary to deeply etch the mounting region M of the PLC platform. Thus, the solder film 240 having a thickness of several micrometers may be used.

The platform alignment mark 220 on the terrace 218 and the chip alignment mark 236 of the optical active chip 230 may have intaglio and relief shapes corresponding to each other, respectively. When the chip alignment mark 236 of the optical active chip 230 is a closed figure having a dam shape, the platform alignment mark 220 on the terrace 218 may be a closed figure having the same configuration with an area less or greater than the closed figure of the chip alignment mark 236 of the optical active chip 230. On the other hand, as shown in FIGS. 3A and 3C, when the chip alignment mark 236 of the optical active chip 230 includes a plurality of patterns, the platform alignment mark 220 on the terrace 218 may be a closed figure or a plurality of patterns having a different configuration, which fills inner spaces between the plurality of patterns. Also, when the platform alignment mark 220 on the terrace 218 includes a plurality of patterns, the chip alignment mark 236 of the optical active chip 230 may be a closed figure or a plurality of patterns having a different configuration, which fills inner spaces between the plurality of patterns.

The optical active chip 230 may be aligned by interlocking between the platform alignment mark 220 on the terrace 218 and the chip alignment mark 236 of the optical active chip 230 and mounted on the mounting region M of the PLC platform. Thus, the optical active chip 230 may not be vertically and horizontally moved by the interlocking between the platform alignment mark 220 on the terrace 218 and the chip alignment mark 236, and thus vertically and horizontally aligned with the PLC platform.

Generally, a commercialized F/C bonding equipment has alignment accuracy of about 1 μm The optical active chip 230 and the PLC platform are aligned with each other using the commercialized F/C bonding equipment. Thereafter, when a predetermined load is applied to only contact the optical active chip 230 with the PLC platform, alignment accuracy therebetween is determined by the alignment accuracy of the F/C bonding equipment. However, to mount the optical active chip 230 on the PLC platform, when the temperature of the F/C bonding equipment increases to melt the solder film 240 disposed between the optical active chip 230 and the PLC platform, significant misalignment may occur during the melting of the solder film 240 due to the difference of thermal expansion coefficients between the optical active chip 230, the PLC platform, and the F/C bonding equipment. Also, when the solder film 240 is melted, the optical active chip 230 may be slipped by a molten solder in case where an excessively large amount of the molten solder is provided. As a result, the misalignment of more than several micrometers may occur, and thus, the optical coupling efficiency may be significantly reduced.

However, since the optical device according to an embodiment of the inventive concept is not horizontally moved by the interlocking between the platform alignment mark 220 on the terrace 218 and the chip alignment mark 236 of the optical active chip 230, the misalignment occurring when the solder film 240 is melted to mount the optical active chip 230 on the PLC platform may be minimized.

A distance D between the platform alignment mark 220 on the terrace 218 and the chip alignment mark 236 of the optical active chip 230 may range from about 1 μm to about 2 μm. Thus, although the alignment occurs when the solder film 240 is melted to mount the optical active chip 230 on the PLC platform, the alignment accuracy within about 2 μm may be secured.

A distance between the PLC waveguide and the optical active chip 230 may range from about 2.5 μm to about 20 μm.

FIGS. 4A through 4F are sectional views taken along line II-II' of FIG. 3A, for explaining a method of fabricating the optical device according to another embodiment of the inventive concept.

Figure 4A:
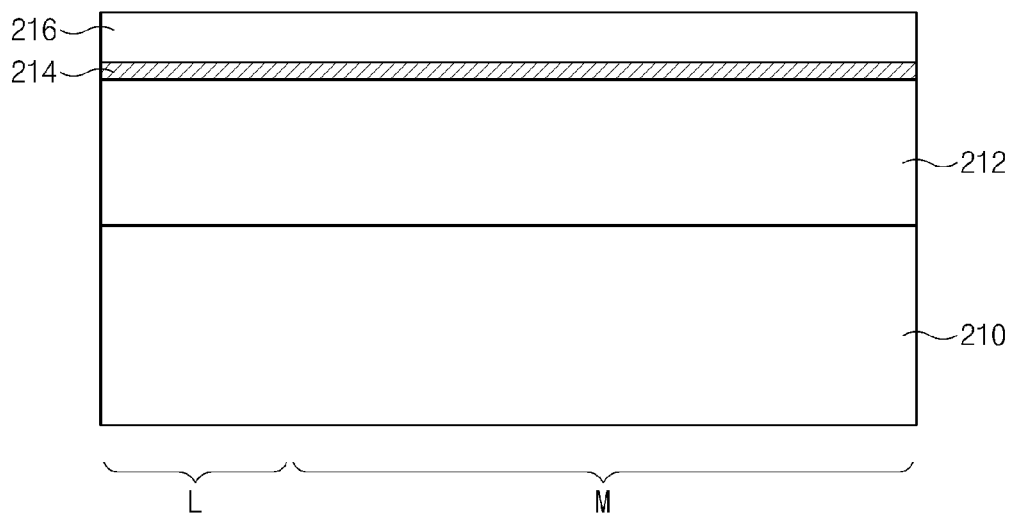
FIGS. 4A through 4F are sectional views taken along line II-II' of FIG. 3A, for explaining a method of fabricating the optical device according to another embodiment of the inventive concept.

Referring to FIG. 4A, a lower-clad layer 212, a PLC core 214, and an upper-clad layer 216 may be sequentially formed on a substrate 210 including a light waveguide region L and a mounting region M.

The substrate 210 may include a Si substrate. The lower-clad layer 212, the PLC core 214, and the upper-clad layer 216 may be formed of a silica film.

Figure 4B:
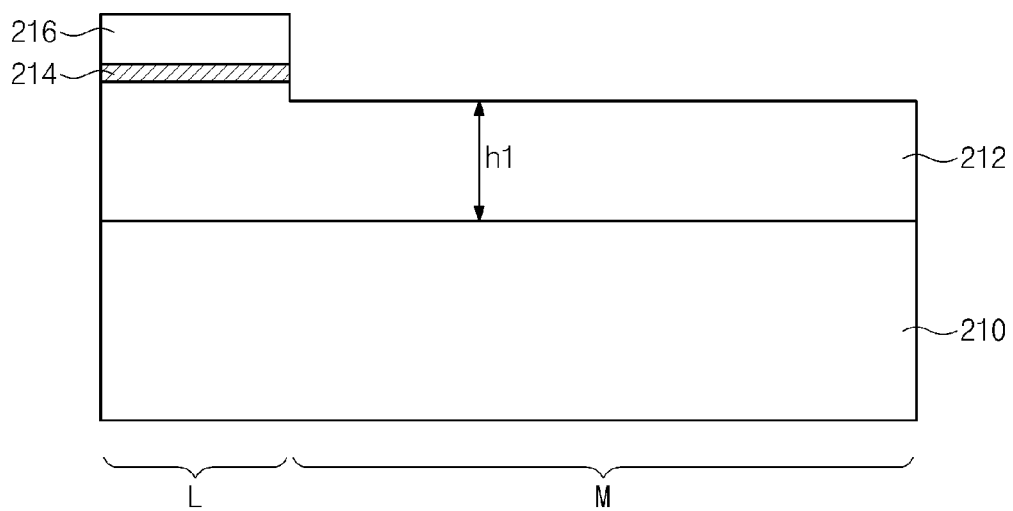

Referring to FIG. 4B, a first etch process is performed on the upper-clad layer 216, the PLC core 214, and the lower-clad layer 212 disposed on the mounting region M of the substrate 210 to form a PLC waveguide including the lower-clad layer 212, the PCL core 214, and the upper-clad layer 216 in the light waveguide region L and the lower-clad layer 212 having a first height h1 in the mounting region M. Thus, the PLC waveguide may include a silica light waveguide.

Figure 4C:
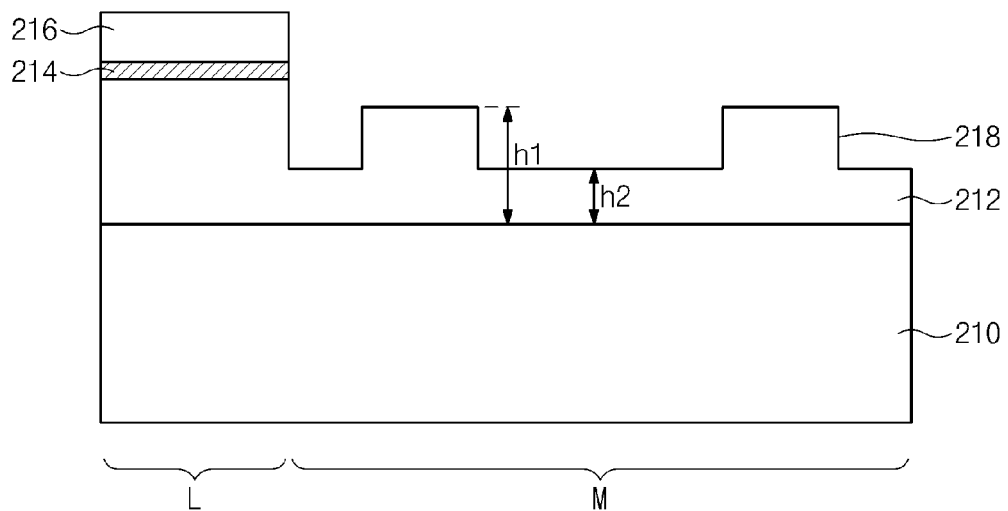

Referring to FIG. 4C, a second etch process is performed on the lower-clad layer 212 having the first height h1 in the mounting region M of the substrate 210 to form a terrace 218 having the first height h1 and the lower-clad layer 212 having a second height h2.

Figure 4D:
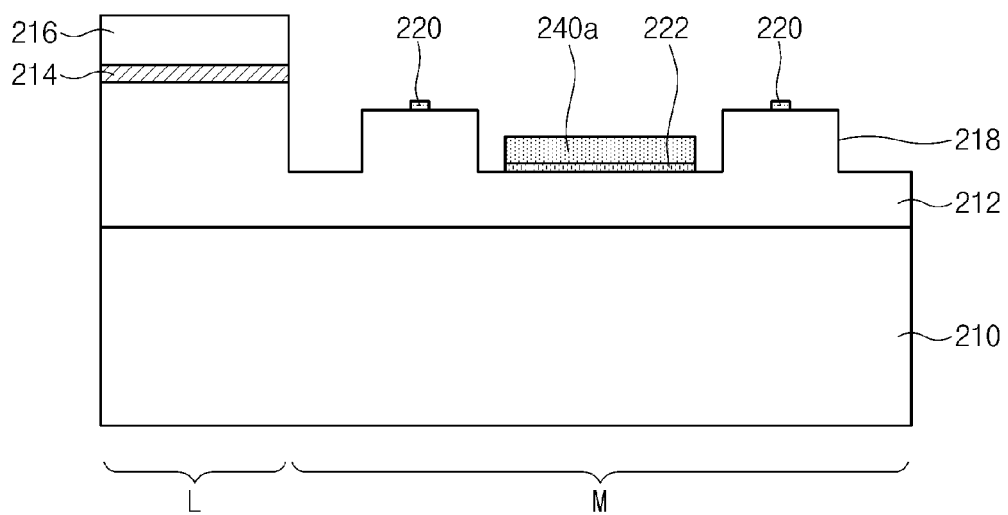

Referring to FIG. 4D, a platform alignment mark 220 and a platform UBM 222 are formed on an upper surface of the terrace 218 and the lower-clad layer 212 having the second height h2 around the terrace 218 in the mounting region M of the substrate 210, respectively.

Each of the platform alignment mark 220 and the platform UBM 222 may include a 3-layer of Cr/Ni/Au, NiCr/Ni/Au, Ti/Ni/Au, Cr/Pt/Au, NiCr/Pt/Au, or Ti/Pt/Au or a 2-layer of Ni/Au. The platform alignment mark 220 and the platform UBM 222 may be formed using processes and materials different from each other or formed at the same time using the same process and material.

The platform alignment mark 220 may be formed together with the platform UBM 222 in deposition and patterning processes for forming the platform UBM 222. Thus, an additional process for forming the platform alignment mark 220 is not required.

Thus, the PLC waveguide may be formed in the light waveguide region L, and a PLC platform including the terrace 218 having the platform alignment mark 220 may be formed in the mounting region M.

A solder film 240a for platform is formed on the platform UBM 222. The solder film 240a for platform may include an AuSn solder. The solder film 240a for platform may have a thickness ranging from about 1 μm to about 4 μm. When a solder film for chip (see reference numeral 240b of FIG. 4E) having a sufficient thickness (about 2 μm to 8 μm) is formed on a chip UBM (see reference numeral 234 of FIG. 4E) formed on a mounting surface of an optical active chip (see reference numeral 230 of FIG. 4E), the formation of the solder film 240a for platform may be omitted.

Figure 4E:
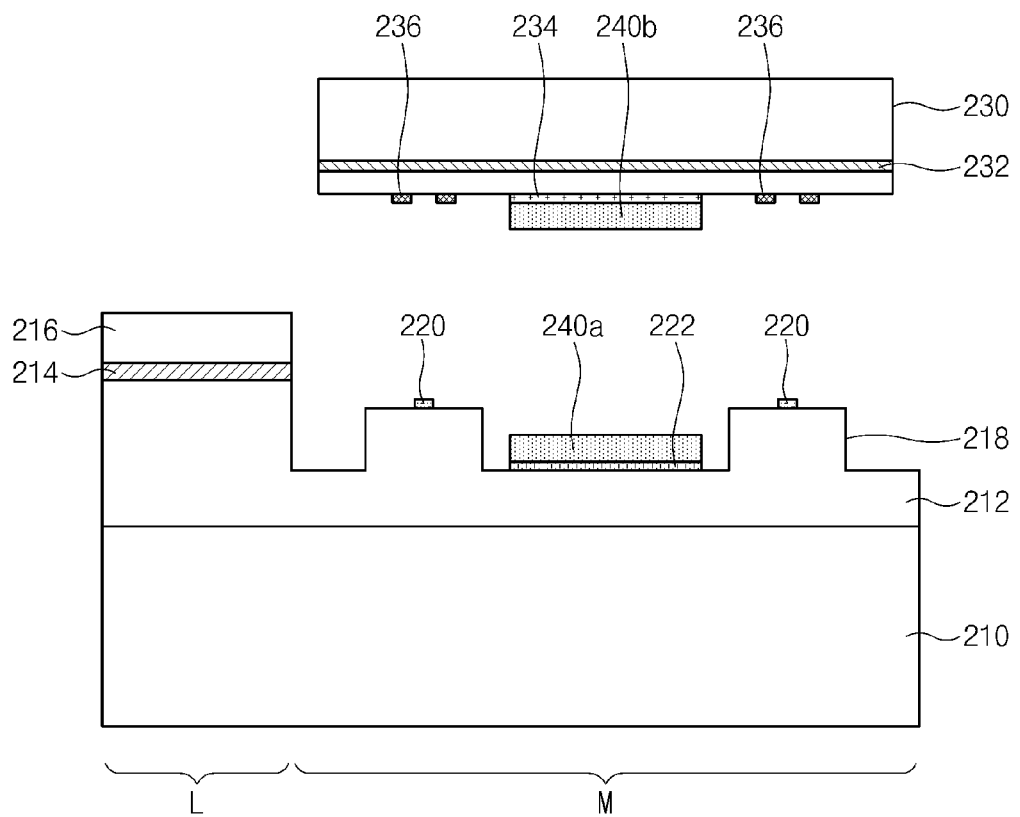

Referring to FIG. 4E, the optical active chip 230 including a chip core 232 therein is prepared. The optical active chip 230 may include a laser diode or a photodiode.

The chip UBM 234 and a chip alignment mark 236 are formed on the mounting surface of the optical active chip 230. Each of the chip UBM 234 and the chip alignment mark 236 may include a 3-layer of Cr/Ni/Au, NiCr/Ni/Au, Ti/Ni/Au, Cr/Pt/Au, NiCr/Pt/Au, or Ti/Pt/Au or a 2-layer of Ni/Au. The chip UBM 234 and the chip alignment mark 236 may be formed using processes and materials different from each other or formed at the same time using the same process and material.

The platform alignment mark 220 on the terrace 218 and the chip alignment mark 236 of the optical active chip 230 may have intaglio and relief shapes corresponding to each other, respectively. When the chip alignment mark 236 of the optical active chip 230 is a closed figure having a dam shape, the platform alignment mark 220 on the terrace 218 may be a closed figure having the same configuration with an area less or greater than the closed figure of the chip alignment mark 236 of the optical active chip 230. On the other hand, as shown in FIGS. 4A and 4C, when the chip alignment mark 236 of the optical active chip 230 includes a plurality of patterns, the platform alignment mark 220 on the terrace 218 may be a closed figure or a plurality of patterns having a different configuration, which fills inner spaces between the plurality of patterns. Also, when the platform alignment mark 220 on the terrace 218 includes a plurality of patterns, the chip alignment mark 236 of the optical active chip 230 may be a closed figure or a plurality of patterns having a different configuration, which fills inner spaces between the plurality of patterns. A distance (see reference symbol D of FIG. 3C) between the platform alignment mark 220 on the terrace 218 and the chip alignment mark 236 of the optical active chip 230 may range from about 1 μm to about 2 μm.

The solder film 240b for chip is formed on the chip UBM 234. The solder film 240b for chip may include an AuSn solder. The solder film 240b for chip may have a thickness ranging from about 1 μm to about 4 μm. When the solder film 240a for platform having the sufficient thickness (about 2 μm to 8 μm) is formed on the platform UBM 222 formed on the lower-clad layer 212 having the second height h2 on the mounting region M of the substrate 210, the formation of the solder film 240b for chip may be omitted.

Figure 4F:
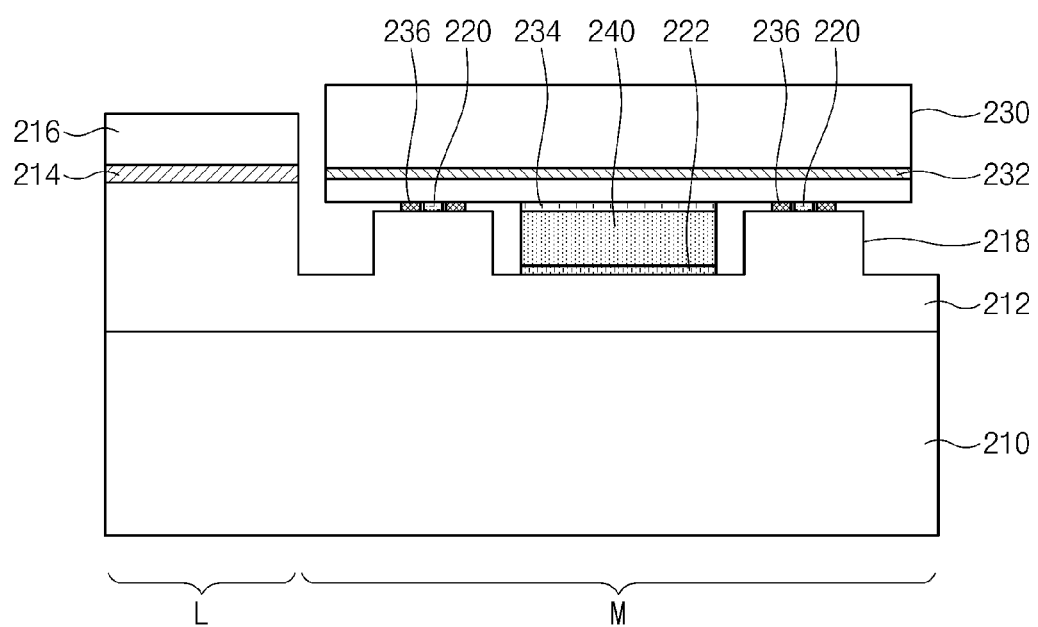

Referring to FIG. 4F, the optical active chip 230 is mounted on the mounting region M of the substrate 210 to electrically connect the platform UBM 222 to the chip UBM 234 by a solder film 240.

As described above, the solder film 240 may represents a solder film formed on the platform UBM 222 or the chip UBM 234 or all of the solder film 240a for platform and the solder film 240b for chip formed on the platform UBM 222 and the chip UBM 234, respectively.

The optical active chip 230 may be aligned by interlocking between the platform alignment mark 220 on the terrace 218 and the chip alignment mark 236 of the optical active chip 230 and mounted on the mounting region M of the PLC platform. Thus, the optical active chip 230 may not be vertically and horizontally moved by the interlocking between the platform alignment mark 220 on the terrace 218 and the chip alignment mark 236, and thus vertically and horizontally aligned with the PLC platform.

Generally, a commercialized F/C bonding equipment has alignment accuracy of about 1 µm. The optical active chip 230 and the PLC platform are aligned with each other using the commercialized F/C bonding equipment. Thereafter, when a predetermined load is applied to only contact the optical active chip 230 with the PLC platform, alignment accuracy therebetween is determined by the alignment accuracy of the F/C bonding equipment. However, to mount the optical active chip 230 on the PLC platform, when the temperature of the F/C bonding equipment increases to melt the solder film 240 disposed between the optical active chip 230 and the PLC platform, significant misalignment may occur during the melting of the solder film 240 due to the difference of thermal expansion coefficients between the optical active chip 230, the PLC platform, and the F/C bonding equipment. Also, when the solder film 240 is melted, the optical active chip 230 may be slipped by a molten solder in case where an excessively large amount of the molten solder is provided. As a result, the misalignment of more than several micrometers may occur, and thus, the optical coupling efficiency may be significantly reduced.

However, since the optical device according to an embodiment of the inventive concept is not horizontally moved by the interlocking between the platform alignment mark 220 on the terrace 218 and the chip alignment mark 236 of the optical active chip 230, the misalignment occurring when the solder film 240 is melted to mount the optical active chip 230 on the PLC platform may be minimized.

A distance D between the platform alignment mark 220 on the terrace 218 and the chip alignment mark 236 of the optical active chip 230 may range from about 1 µm to about 2 µm. Thus, although the alignment occurs when the solder film 240 is melted to mount the optical active chip 230 on the PLC platform, the alignment accuracy within about 2 µm may be secured.

A distance between the PLC waveguide and the optical active chip 230 may range from about 2.5 µm to about 20 µm.

The respective optical devices according to the embodiments of the inventive concept have a structure in which the PLC platform and the optical active chip are flip-bonded using the interlocking therebetween. Thus, unlike a typical optical device that uses a solder bump of more than several tens micrometers in order to use self-alignment of a solder, the optical device according to the embodiments of the inventive concept uses the solder film of several micrometers. Thus, the optical device in which expensive costs of solder formation process may be reduced may be provided. Also, since the solder film is formed on the PLC platform and the optical active chip, respectively, each of the solder films may become thinner. Thus, the optical device in which the costs of solder formation process may be additionally reduced may be provided.

Also, in the methods of fabricating the optical device according to the embodiments of the inventive concept, since an additional process for forming a structure for the interlocking between the PLC platform and the optical active chip is not required, the existing PLC platform formation process may be used as it is. Thus, the optical device in which the structure for the interlocking between the PLC platform and the optical active chip may be easily realized, and simultaneously, additional process costs may not be required may be provided.

In addition, since the respective optical devices according to the embodiments of the inventive concept have a structure in which the PLC platform and the optical active chip are flip-bonded using the interlocking therebetween, the misalignment that may occur during the melting of the solder film may be limited within about 2 µm. Thus, the optical device in which the optical coupling efficiency between the PLC platform and the optical active chip may be improved, and simultaneously, yield due to the F/C bonding may be maximized may be provided.

Therefore, in the optical devices according to the embodiments of the inventive concept, the costs of solder formation process that are a major obstacle to commercialize the optical module using the PLC hybrid integration technology may be reduced. In addition, the yield and the optical coupling efficiency due to the F/C bonding may be improved. Also, in the optical devices according to the embodiments of the inventive concept, when the optical transceiver and optical amplification module are mass produced, the productivity may be improved, and the optical module may be low in price.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and it shall not be restricted or limited by the foregoing detailed description.

What is claimed is:

1. An optical device comprising:
    a substrate having a waveguide region and a mounting region;
    a planar lightwave circuit (PLC) waveguide including
        a lower-clad layer and an upper-clad layer that each have a waveguide portion disposed on the waveguide region, the lower-clad layer further having a mounting portion disposed on the mounting region, and
        a platform core between the waveguide portions of the lower-clad layer and the upper-clad layer;
    a terrace defined by etching the mounting portion of the lower-clad layer, the terrace comprising an interlocking part;
    an optical active chip mounted on the mounting region of the substrate, the optical active chip comprising a chip core therein;
    a chip alignment mark disposed on a mounting surface of the optical active chip, the chip alignment mark protruding from the mounting surface so as to extend from the mounting surface of the optical active chip into the interlocking part, wherein the optical active chip is aligned by interlocking between the interlocking part and the chip alignment mark, and the optical active chip is mounted on the mounting region; and a solder film disposed on the chip alignment mark so as to be within the interlocking part, the solder film protruding from a bottom surface of the chip alignment mark so as to protrude farther into the interlocking part than the chip alignment mark.

2. The optical device of claim 1, wherein the interlocking part comprises a trench defined by etching the terrace.

3. The optical device of claim 1, further comprising:
a platform under bump metallurgy (UBM) disposed on the etched mounting portion of the lower-clad layer and around the terrace, the platform UBM being disposed on the mounting region of the substrate; and
a chip UBM disposed on the mounting surface of the optical active chip.

4. The optical device of claim 3, further comprising an additional solder film electrically connecting the platform UBM to the chip UBM.

5. The optical device of claim 4, wherein the chip alignment mark includes a plurality of chip alignment marks, and the additional solder film electrically connecting the platform UBM to the chip UBM, the platform UBM and the chip UBM are disposed between the chip alignment marks.

6. The optical device of claim 1, wherein
a bottommost surface of the solder film does not touch any solid surface of the interlocking part.

7. The optical device of claim 6, wherein a side surface of the solder film that is orthogonal to the bottommost surface of the solder film touches a solid surface of the interlocking part.

8. The optical device of claim 1, wherein the solder film is made of a different material than that of the chip alignment mark.

9. An optical device comprising:
a substrate having a waveguide region and a mounting region;
a planar lightwave circuit (PLC) waveguide including
a lower-clad layer and an upper-clad layer that each have a waveguide portion disposed on the waveguide region, the lower-clad layer further having a mounting portion disposed on the mounting region, and
a platform core between the waveguide portions of the lower-clad layer and the upper-clad layer;
terraces defined by etching the mounting portion of the lower-clad layer;
platform alignment marks protruding from uppermost surfaces of the terraces so as to extend above the uppermost surfaces of the terraces;
an optical active chip mounted on the mounting region of the substrate, the optical active chip comprising a chip core therein; and
chip alignment marks disposed on a mounting surface of the optical active chip, the chip alignment marks protruding from the mounting surface so as to extend from the mounting surface of the optical active chip so that the platform alignment marks are disposed between the chip alignment marks, at least one of the chip alignment marks being disposed within the platform alignment marks with a gap therebetween so as to be free of any contact with the platform alignment marks,
wherein the optical active chip is aligned by interlocking the platform alignment marks and the chip alignment marks, and the optical active chip is mounted on the mounting region.

10. The optical device of claim 9, wherein the platform alignment marks and the chip alignment marks have intaglio and relief shapes corresponding to each other, respectively.

11. The optical device of claim 9, further comprising:
a platform under bump metallurgy (UBM) disposed on the etched mounting portion of the lower-clad layer and between the terraces, the platform UBM being disposed on the mounting region of the substrate;
a chip UBM disposed on the mounting surface of the optical active chip and between the terraces; and
a solder film electrically connecting the platform UBM to the chip UBM.

12. The optical device of claim 11, wherein the chip UBM is disposed on a straight line that extends from a first of the chip alignment marks to a second of the chip alignment marks.

13. The optical device of claim 9, wherein the at least one of the chip alignment marks, that is disposed within the platform alignment marks with the gap therebetween, and all of the platform alignment marks are disposed in a same horizontal plane.

14. An optical device comprising:
a substrate having a waveguide region and a mounting region, the substrate being a silicon substrate;
a planar lightwave circuit (PLC) waveguide including
a lower-clad layer and an upper-clad layer that each have a waveguide portion disposed on the waveguide region, the lower-clad layer further having a mounting portion disposed on the mounting region, and
a platform core between the waveguide portions of the lower-clad layer and the upper-clad layer,
wherein the lower-clad layer, the platform core, and the upper-clad layer are formed of silica;
terraces defined by dry etching the mounting portion of the lower-clad layer, each terrace comprising an interlocking part including a trench;
an optical active chip mounted on the mounting region of the substrate, the optical active chip comprising a chip core therein; and
chip alignment marks disposed on a mounting surface of the optical active chip, the chip alignment marks protruding from the mounting surface so as to extend from the mounting surface of the optical active chip into the trenches so that each trench has a chip alignment mark disposed therein,
wherein an inner circumference surface of the trenches has a shape corresponding to that of an outer circumference surface of the chip alignment marks, and
wherein the optical active chip is aligned by interlocking the interlocking parts and the chip alignment marks, and the optical active chip is mounted on the mounting region.

15. The optical device of claim 4, further comprising:
a platform under bump metallurgy (UBM) disposed on the etched mounting portion of the lower-clad layer and between the terraces, the platform UBM being disposed on the mounting region of the substrate;
a chip UBM disposed on the mounting surface of the optical active chip and between the terraces; and
a first solder film electrically connecting the platform UBM to the chip UBM.

16. The optical device of claim 15, wherein the chip UBM is disposed on a straight line that extends from a first of the chip alignment marks to a second of the chip alignment marks.

17. The optical device of claim 16, further comprising second solder films disposed on the chip alignment marks, the second solder films do not touch the first solder film,
  wherein the second solder films are disposed on the chip alignment marks so as to be within the interlocking parts,
  the second solder films protruding from bottom surfaces of the chip alignment marks so as to protrude farther into the interlocking parts than the chip alignment marks.

18. The optical device of claim 17, wherein bottommost surfaces of the second solder films do not touch any solid surface of the interlocking parts, the second solder films each being made of a different material than that of the chip alignment marks.

19. The optical device of claim 18, wherein other surfaces of the second solder films touch solid sidewalls of the interlocking parts.

20. The optical device of claim 14, wherein a first plurality of the chip alignment marks are disposed in a first of the trenches, and a second plurality of the chip alignment marks are disposed in a second of the trenches.

* * * * *